United States Patent [19]
Schreiner

[11] Patent Number: 6,164,984
[45] Date of Patent: Dec. 26, 2000

[54] ELECTRICAL CONNECTING ELEMENT

[75] Inventor: Helmut Schreiner, Karlsfeld, Germany

[73] Assignee: Schreiner Etiketten Und Selbstkelbetechnik GmbH & Co., Oberschleinheim, Germany

[21] Appl. No.: 09/283,293

[22] Filed: Apr. 1, 1999

[51] Int. Cl.⁷ ..................................... H01R 4/58
[52] U.S. Cl. .............. 439/86; 439/931; 439/916
[58] Field of Search .............. 439/86, 916, 931, 439/886, 77, 67

[56] References Cited

U.S. PATENT DOCUMENTS

| | | | |
|---|---|---|---|
| 4,113,981 | 9/1978 | Fujita et al. | 174/88 R |
| 4,231,041 | 10/1980 | Graeser, Jr. et al. | 343/767 |
| 4,489,999 | 12/1984 | Miniet | 439/77 |
| 4,815,981 | 3/1989 | Mizuno | 439/77 |
| 5,033,675 | 7/1991 | Shino | 439/86 |
| 5,285,048 | 2/1994 | Nakase | 219/203 |
| 5,416,622 | 5/1995 | Enger et al. | 359/88 |
| 5,534,879 | 7/1996 | Braun et al. | 343/713 |
| 5,610,618 | 3/1997 | Adrian et al. | 343/713 |
| 5,712,645 | 1/1998 | Jellumn et al. | 343/713 |
| 5,719,749 | 2/1998 | Stopperan | 174/254 |
| 5,936,850 | 8/1999 | Takahashi et al. | 439/67 |
| 5,990,692 | 11/1999 | Jeong et al. | 324/755 |

*Primary Examiner*—T. C. Patel
*Attorney, Agent, or Firm*—Nixon Peabody LLP; Donald R. Studebaker

[57] ABSTRACT

An electrical connecting element for connecting an electrical accessory, such as an antenna or heater provided on a window, to the car circuitry. The connecting element includes at least one flexible sheet having an upper surface and a lower surface. The lower surface of the sheet is at least partially coated with a conductive adhesive. At least one connector is disposed on the upper surface of the sheet for connection to the electrical accessory. At least one conductive trace is disposed on the upper surface of the sheet. In one embodiment, the at least one conductive trace is coupled to the conductive adhesive and the connector. In another embodiment, the connector is coupled to the conductive adhesive. In still another embodiment, a through-hole is disposed in the sheet. The through-hole is filled with a conductive material, wherein the conductive material protrudes from the lower surface of the sheet and the adhesive coated thereon for establishing an electrical contact with the conductive portion. The present invention also relates to a method for electrically coupling the electrical accessory to a car window, including the step of providing a plurality of electrical connecting elements on a carrier web. At least one of the electrical elements is separated from the carrier web and adhesively applied to the window and the electrical accessory is connected to the connector.

23 Claims, 3 Drawing Sheets

ELECTRICAL CONNECTING ELEMENT

BACKGROUND OF THE INVENTION

1. Field of the Invention

The present invention relates to an electrical connecting element, and more particularly to a connecting element for connecting an antenna or heater arrangement to a radio or a power source, respectively. Such antenna or heater arrangements are usually formed by conductive traces, for instance, traces printed on car windows.

2. Description of the Related Art

In the past, many attempts have been made to establish an effective connection for an electrical wire arrangement serving as heater and/or radio antenna which is usually provided in or on the rear window of a car.

Such a wire arrangement is realized either by embedding wires into a pane or by coating the window with one or more traces of a conductive material, for example, silver paste, as disclosed in U.S. Pat. No. 5,285,048. In order to connect this arrangement to the car radio or a power source, a connecting element providing a junction to which a connection cable can be attached has to be mounted onto the window. One way of making this external connection is disclosed in U.S. Pat. No. 5,610,618, where the outer perimeter of the window is coated with a conductive adhesive to connect the pane with the conductive periphery of the vehicle body to establish contact of the conductive traces placed on the window with the car circuitry.

Another known way to establish an electrical connection is to provide a metallic socket on the window. The prior art connecting element usually provides a contacting portion which connects to a conductive trace of the windows whenever the connecting element is soldered onto the socket. This way of mechanically pressing the contacting portion of the connecting element against a conductive trace happens to be rather unsatisfactory, since the contact might loosen after a time resulting in a lack of performance. Furthermore, since the prior art connection element has a significant elevation above the actual surface of the window, mechanical influences, such as hits occurring during transportation of the prepared car windows, can result in serious damage or may eventually destroy the soldering junction completely. In addition, the process of soldering is very time consuming and may eventually lead to the destruction of the window due to the resulting heat.

Yet another way of connecting such a connecting element is disclosed in U.S. Pat. No. 5,534,879. In this case, the car window consists of two panes laminated together. The wire arrangement consists of a conductive copper foil sandwiched between the laminated panes. In order to make the external connection, one portion of the foil is wrapped around one pane and is fixed on its backside. A press-stud, which is capable of accepting a plug connected to the car circuitry, is then soldered onto the foil. As stated above, this manner of connecting the window's wire arrangement will not withstand mechanical influences, for instance those occurring during transportation. Moreover, the actual window must be made of two panes to enable this kind of implementation of a copper foil, most certainly raising the cost of production significantly.

SUMMARY OF THE INVENTION

An object of the present invention is to overcome the deficiencies of the prior art by providing a connecting element which can be easily mounted onto a car window or the like without employing any costly steps during production, such as soldering.

Another object of the present invention is to provide a connecting element which can be mounted on a conventional window coated by conductive traces.

A further object of the present invention is to provide a connecting element which withstands external mechanical influences like hits occurring during transportation, and which is capable of being automatically applied onto a desired surface.

In accomplishing these and other objectives of the present invention, there is provided an electrical connecting element for coupling a cable to a conductive section provided on a non-conductive object, such as a window pane, wherein the electrical connecting element comprises at least one flexible sheet having an upper surface and a lower surface which is at least partially coated with a conductive adhesive. The upper surface has at least one conductive trace and a connector for connecting to the cable. The conductive trace is coupled to the conductive adhesive and to the connector.

Due to its flexibility, the electrical connecting element can be secured on a carrier material and may be rolled up similar to a regular roll of adhesive tape. Since, in the car industry, the process of mounting prior art connecting elements to the windows is carried out as one step in an assembly line, the present invention allows a very effective integration into the manufacturing process. In a way much similar to sticking labels onto a surface, the new electrical connecting element can be easily and cost effectively applied to the windows as compared to prior art techniques.

The flexible sheet may preferably consist of a non-conductive material. This allows the integration of other conductive traces and/or circuitry on the upper surface of the sheet. Furthermore, the sheet may contain a through-hole through which the conductive trace printed on the sheet can more easily be coupled to the conductive adhesive located on the other side of the flexible sheet. To establish an even better connection of the conductive trace and the adhesive, the through-hole may additionally be filled with a conductive material preferably a material including silver paste.

When the electronic connecting element is used to connect a car antenna, an antenna matching module, which is basically a frequency filtering circuit, is necessary to supply a car radio with the proper radio frequencies and to exclude annoying high frequency components that could degrade the performance of the car radio. In one embodiment of the invention, electronic components are coupled between the connector and are preferably attached adhesively to the upper surface of the flexible sheet and the conductive trace. This arrangement may form a part of the antenna matching module.

Most of the conductive adhesives in use today have the disadvantage of rather poor sticking quality. In order to support the adhesive power of the layer of conductive adhesive on the lower surface of the flexible sheet, a second adhesive of sufficiently high adhesive power is additionally provided.

The entire electrical connecting element may preferably be covered by a protective cover which may be laminated over the entire surface. This cover protects the connecting element, especially if there is circuitry placed on the flexible sheet, from being scraped off due to mechanical influences, from being influenced by charging effects, and from being short-circuited by liquids, such as water, that might condense on the car window. The cover may also include a conductive layer to shield the connecting element from external electric or magnetic fields.

In order to couple more than one conductive trace printed on a car window to the connecting element, the conductive adhesive located on the lower surface of the flexible sheet may be provided in at least two regions electrically isolated from each other.

The contacting of the conductive adhesive on the lower surface of the flexible sheet and the electronic components on the opposite side of the sheet may alternatively be realized by providing at least one pin which perforates the sheet and thus penetrates down to the layer of conductive adhesive. This allows the connector to be directly mounted onto the electronic components which drastically reduces the necessary amount of conductive traces to be printed on the flexible sheet. That way, further electronic components can be connected with the connecting element after it has already been mounted on a car window.

According to another aspect of the invention, the electrical connecting element for coupling a cable to a conductive section provided on a non-conductive object, such as a window pane, comprises at least one flexible sheet having an upper and a lower surface. The lower surface is at least partially coated with a conductive adhesive and the upper surface has at least one connector for connecting the cable. The connector is coupled to the conductive adhesive. In this embodiment, conductive traces on the upper surface of the flexible sheet are not necessary, resulting in an improved protection of the circuitry against external mechanical and other influences.

Yet another aspect of the invention is provided by an electrical connecting element for coupling a cable to a conductive section provided on a non-conductive object, such as a window pane, which comprises at least one flexible sheet having an upper and a lower surface. The lower surface is at least partially coated with an adhesive and the upper surface has at least one conductive trace and a connector coupled to that trace for connecting the cable. The sheet has a through-hole filled with a conductive material, and the conducting material protrudes from the lower surface of the sheet and the adhesive for establishing an electric contact with the conductive section. In this embodiment, the sticking power of the connecting element is improved, since a non-conductive adhesive can be used providing more adhesive power leading to a connecting element that is less affected by external influences and secures a long lasting high-quality performance.

Other features and advantages of the present invention will become apparent from the following description of the invention, which refers to the accompanying drawings.

DETAILED DESCRIPTION OF THE PREFERRED EMBODIMENTS

Figure 1:
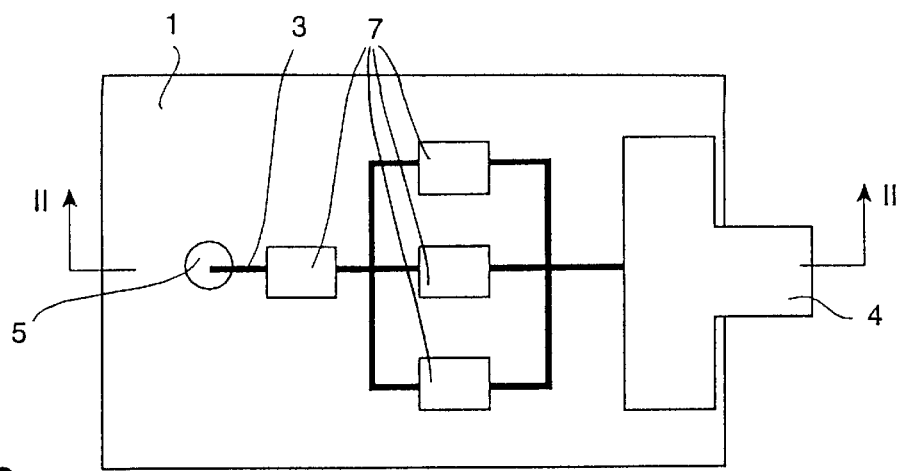
FIG. 1 is a top, plan view of a connecting element according to a first embodiment of the present invention.
Figure 2:
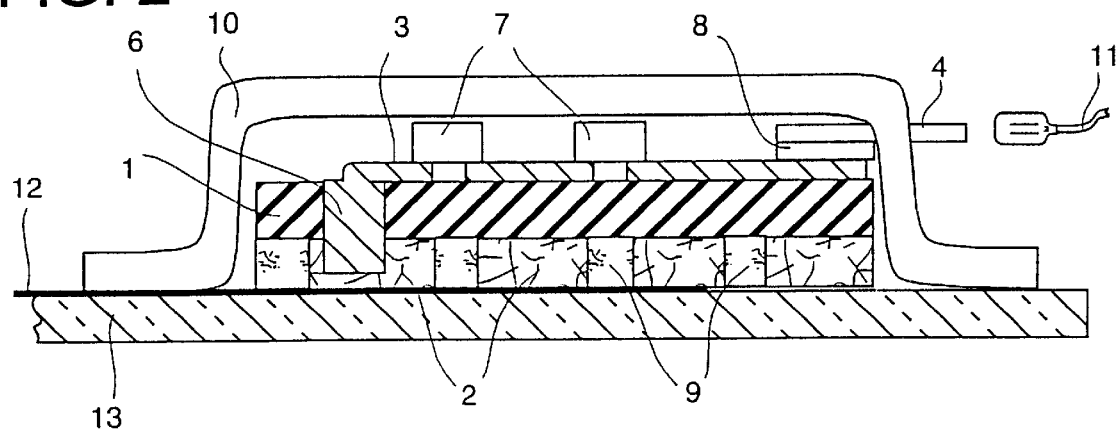
FIG. 2 is a cross-sectional view of the first embodiment taken along the line II—II of FIG. 1.

Referring to FIGS. 1 and 2, the electrical connecting element is mounted to an insulating surface 13, for example a pane forming the window of a car. The surface 13 is partially coated with conductive traces 12. The connecting element of the invention serves the purpose of connecting the conductive traces 12, which may function as a window heater or antenna, to a cable 11 which is in turn connected to the interior circuitry of the car leading to the power supply, the car radio, or the like. In order to serve the purpose as described, the actual connecting element includes a layer of conductive adhesive 2 to fix it to the desired spot on the underlying pane 13. Above this layer, there is located a flexible sheet material 1 which forms the base layer of the connecting element. The sheet material is an insulating material, e. g., polyester or other plastic material. The sheet material 1 is covered with one or more conductive traces 3 which mainly consist of a silver paste and are usually printed onto the flexible sheet 1 using a screen printing technique.

One end of the conductive trace 3 is coupled to a connector 4 by means of an adhesive 8. The cable 11 can then be plugged onto the connector 4 to establish a link between connecting element 10 and the car circuitry. The other end of the conductive trace 3 is coupled to the conductive adhesive layer 2 on the under surface 16 of the sheet material 1 and hence to the conductive trace 12 printed on the pane 13.

Figure 3:
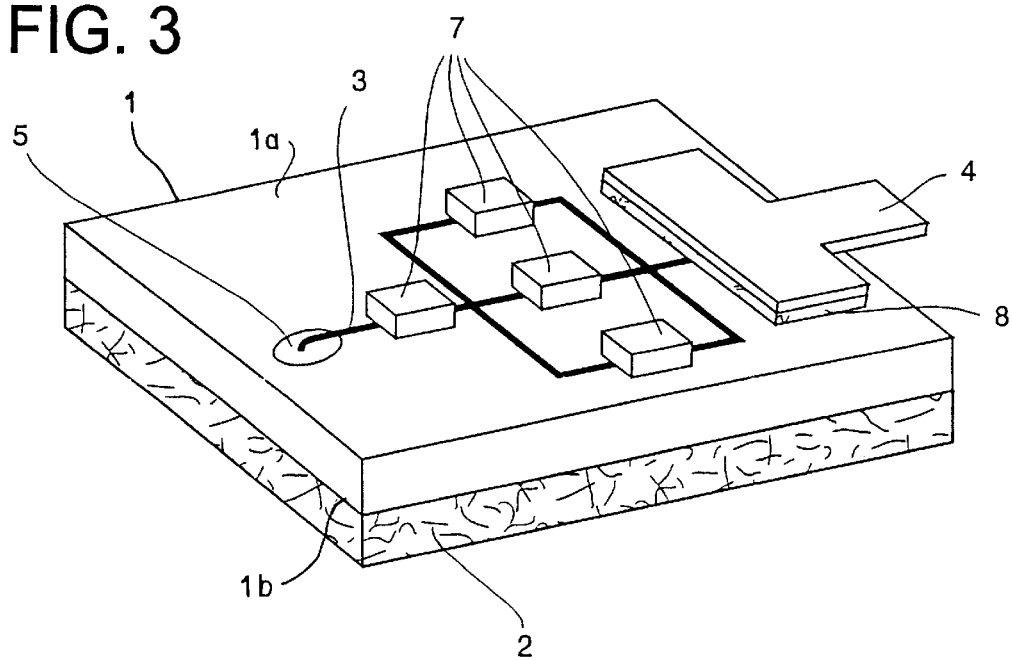
FIG. 3 is a perspective view of the first embodiment of the present invention.

As shown in FIG. 3, the flexible sheet 1 has a through-hole 5 which enables the connection of the conductive trace 3 on the sheet's upper surface 1a and the conductive adhesive layer 2 on its lower surface 1b. To improve the contact of the conductive adhesive 2 and the conductive trace 3, the through-hole 5 may additionally be filled with a conductive material 6, preferably containing silver paste.

Most conductive adhesives available have reduced adhesive power. For that reason, an additional non-conductive adhesive 9 having a high adhesive power may be added to the layer of conductive adhesive 2 to ensure a long-lasting adhesion of the connecting element to the desired spot.

Especially when connecting car antennae, matching circuits are necessary to perform a frequency matching of the signal received by a car antenna. In a matching circuit, high annoying frequency components are usually filtered out to eventually guarantee better performance of a car radio, a navigation system, or a telecommunication system. The best results are usually obtained whenever the matching circuit is placed as close to the actual antenna as possible. In the present invention, the components 7 and the circuitry necessary to form such a matching circuit (e. g. amplifiers, capacitors, and other electronic components) may be placed directly onto flexible sheet 1, as shown in FIG. 1. This keeps the travelling distance of the signal received by the antenna before entering the matching circuitry as short as possible, thus keeping the losses in signal quality to a minimum.

Referring again to FIG. 2, a protective cover 10 can be laminated onto the whole structure to prevent the connecting element from being damaged by mechanical influences, insuring that there is no danger of scraping off the conductive traces 3 or short-circuiting the circuitry, for instance by condensed water forming on a window. In addition, the protective cover 10 may include a metallic layer for shielding the circuitry against external electric and magnetic fields. A further protective layer (not shown) may be additionally laminated onto sheet 1 including the conductive traces 3.

Figure 4:
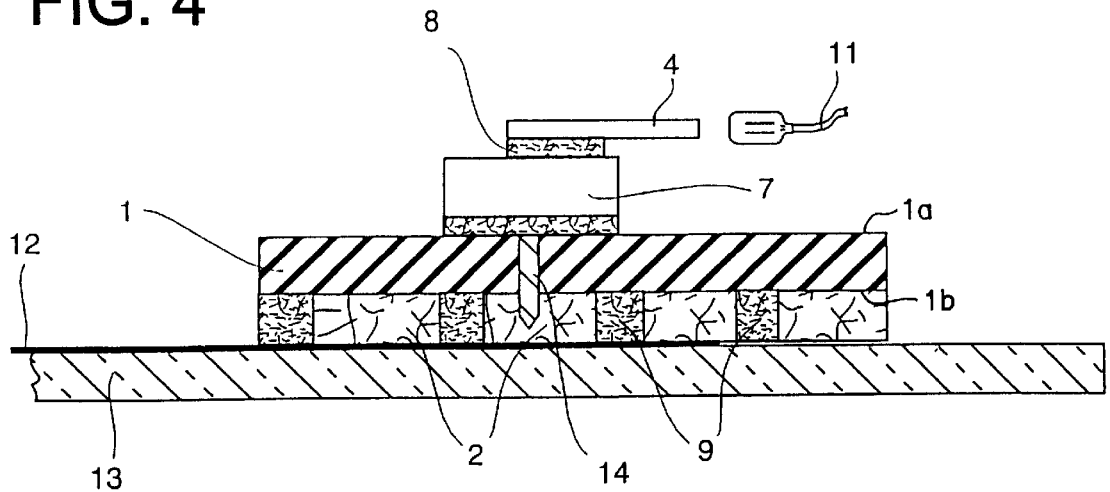
FIG. 4 is a cross-sectional view of a connecting element according to a second embodiment of the present invention.

FIG. 4 illustrates the electrical connecting element according to another embodiment of the invention. Again the connecting element is attached on an insulating carrier 13, for instance the window of a car having conductive traces 12 printed thereon, by means of a layer of conductive adhesive 2. To improve the sticking power of the connecting element, an additional non-conductive adhesive 9 may be included in one or more spots on the adhesive layer 2. Above the adhesive layer 2 there is provided flexible sheet 1 which is preferably made of a metallic material. On this sheet electronic components 7, such as amplifiers, matching circuits, or the like may be arranged depending on the particular application purpose of the connecting element. In order to couple the connecting element to the cable 11, and therefore to the actual car circuitry, one or more connectors 4 are directly connected by adhesive layer 8 to the electronic components 7. The coupling of components 7 to the conductive traces 12, forming the heater or antenna printed on the car window, via the conductive adhesive 2 is achieved by providing a conductive pin 14 mounted substantially perpendicular to the under surface of electronic components 7. Whenever electronic components 7 are attached to flexible sheet 1, the sheet is perforated by the pin 14 which then penetrates down to the conductive adhesive 2 establishing the intended connection to the conductive trace 12.

In the embodiment of FIG. 4, it is not necessary to print conductive traces on the upper surface 1a of the flexible sheet 1. All circuitry may be included in the electronic components 7 which can be mounted onto the sheet 1 as integrated circuits, even after the connecting element has already been irreversibly attached to the desired spot on the car window. Since conductive traces are not necessary, this embodiment is a cost saving alternative due to the reduction of production steps.

However, especially for coupling more than one conductive trace 12 printed onto the car window 13, it is appropriate to create a layout of conductive traces on the lower surface of the flexible sheet 1 using both conductive adhesive 2 and non-conductive adhesive 9, such that they are arranged as conductive and non-conductive regions eventually forming a circuitry layout pattern. The proper coupling of these conductive adhesive patterns is then achieved by arranging electronic components 7 having contacting pins 14 at the respective spots on the upper surface of flexible sheet 1.

As already described above, a protective cover may again be laminated onto the whole structure to prevent the connecting element from being damaged by mechanical influences, so that there is no danger of short-circuiting the circuitry, for instance by condensed water forming on a window. In addition, the protective cover may include a metallic layer for shielding the circuitry against external electric and magnetic fields.

Figure 5:
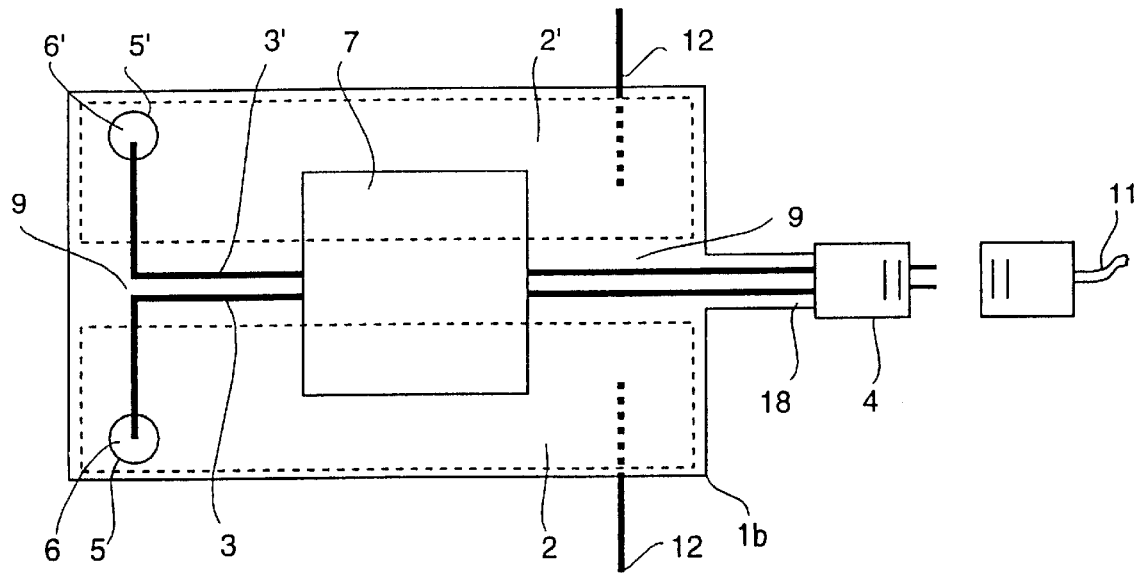
FIG. 5 is a top plan view of the connecting element according to a third embodiment of the invention.

One example of another embodiment of the present invention is shown in FIG. 5. This embodiment is most appropriate whenever more than one conductive trace 12 is to be connected, especially with a heater where there are at least two terminals necessary to supply the heating current from the car battery.

On the lower surface 1b of the flexible sheet 1 there are two or more regions of conductive adhesive 2 and 2' which are indicated in FIG. 5 by dashed lines. These regions can be separated from each other by either providing a non-conductive adhesive 9 therebetween or no adhesive at all. To make the regions of conductive adhesive accessible to the conductive traces 3, 3' printed on the upper surface of the flexible sheet 1, through-holes 5, 5' are provided. Additional circuitry 7 may be attached to the sheet's upper surface whenever appropriate. The through-holes 5, 5' may additionally be filled with a conductive material 6,6' preferably including a silver paste or the like. To connect the connecting element to a cable 11 leading to the actual car circuitry, the flexible sheet 1 may comprise a strip 18 protruding from the sheet. The one or more conductive traces 3, 3' may then extend onto the strip 18. That way a connector 4, preferably a clamping plug or the like, may be easily mounted by clamping the connector to the strip 18. Any protective layer provided on the conductive traces 3, 3' may be removed locally before mounting the connector 4. Of course, providing a connector 4 which can be attached to either the conductive traces 3, 3' or even the electronic components 7 as described in the other embodiments above is also possible.

Again, a protective cover may be laminated onto the whole connecting element to prevent it from being damaged by mechanical influences, so that there is no danger of scraping off the conductive traces 3, 3' or short-circuiting the circuitry. In addition, the protective cover may include a metallic layer for shielding the circuitry against external electric and magnetic fields.

Figure 6:
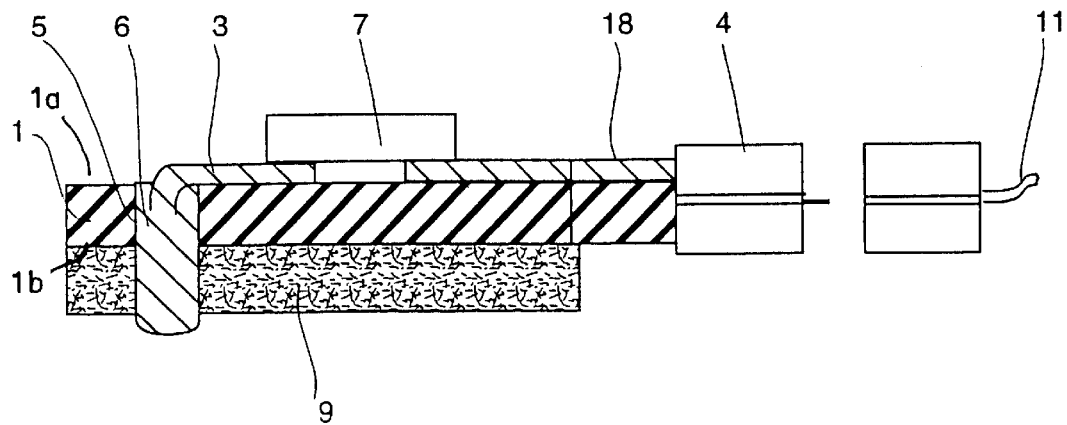
FIG. 6 is a cross-sectional view of a fourth embodiment of the present invention.

Yet another embodiment of the present invention is shown in FIG. 6. In this embodiment, the connecting element uses non-conductive adhesive 9. This guarantees an even greater sticking power of the flexible sheet 1 and therefore a greater sticking power of the connecting element, as compared when using a conductive adhesive. In the flexible sheet 1 one or more through-holes 5 are provided to enable the coupling of the conductive traces 3 on the sheet's upper surface 1a to the conductive trace printed onto the car window (not shown). The through-holes 5 are filled with conductive material 6 including preferably a silver paste or the like. Conductive material 6 protrudes from the lower surface 1b of flexible sheet 1 and non-conductive adhesive 9 to eventually enable the contacting of the conductive trace (not shown). On the upper surface 1a of flexible sheet 1, one or more conductive traces 3 are provided by a screen printing technique. Also, as described above, depending on the particular application of the connecting element, circuitry, like amplifying or matching circuits formed by electronic components 7, may be added onto the flexible sheet 1. To connect the connecting element to cable 11 leading to the actual car circuitry, the flexible sheet 1 may comprise strip 18 protruding therefrom. The one or more conductive traces 3 may then extend onto strip 18. That way a connector 4, preferably a clamping plug or the like, may be easily mounted by clamping it to strip 18. Other ways to attach connector 4, as described above are also possible.

A protective cover may again be laminated onto the whole connecting element to prevent it from being damaged by mechanical influences, so that there is no danger of scraping off the conductive traces 3 or short-circuiting the circuitry. In addition, the protective cover may include a metallic layer for shielding the circuitry against external electric and magnetic fields.

Figure 7:
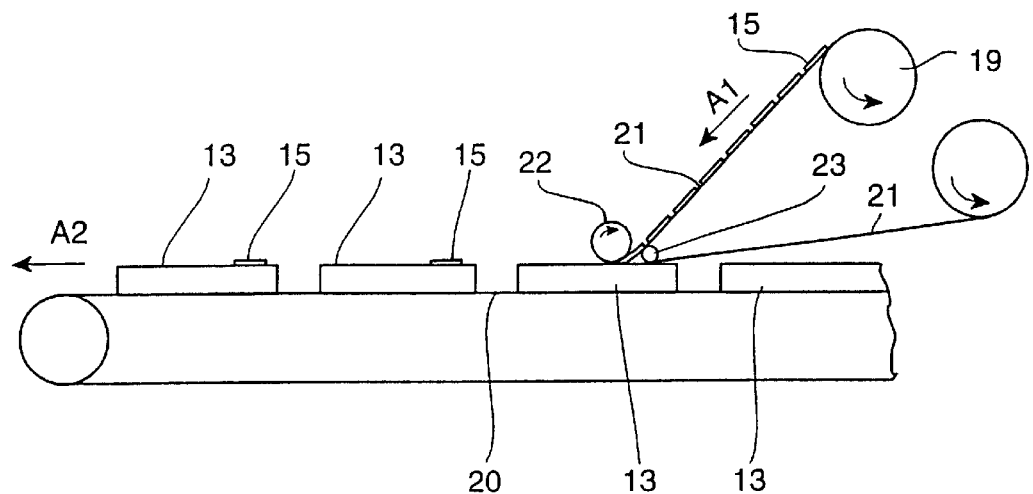
FIG. 7 illustrates the process of applying the connecting element to a carrier, such as a car window.

FIG. 7 illustrates the process for applying connecting elements 15, according to the invention, to the car windows 13. The connecting elements 15 are provided on a carrier web 21 which is coated with a release layer so that the connecting elements 15 stick on the carrier web 21 with only a small adhesion force. The carrier web 21 and the connecting elements 15 disposed on it move in the direction of arrow Al towards the prepared car windows 13 disposed on the conveyor belt 20 moving in the direction of arrow A2. The carrier web 21 is drawn over an edge 23 having a small radius so that the connecting element 15 does not follow the bending movement of the carrier web 21 around the edge 23, but rather continues its straight motion and comes close to the car window 13 on conveyor belt 20. At this time, the adhesive layer of the connecting element begins to grip window 13 and then continues its motion in the direction of A2 while simultaneously being pressed onto window 13 by means of a roller press 22.

Figure 8:
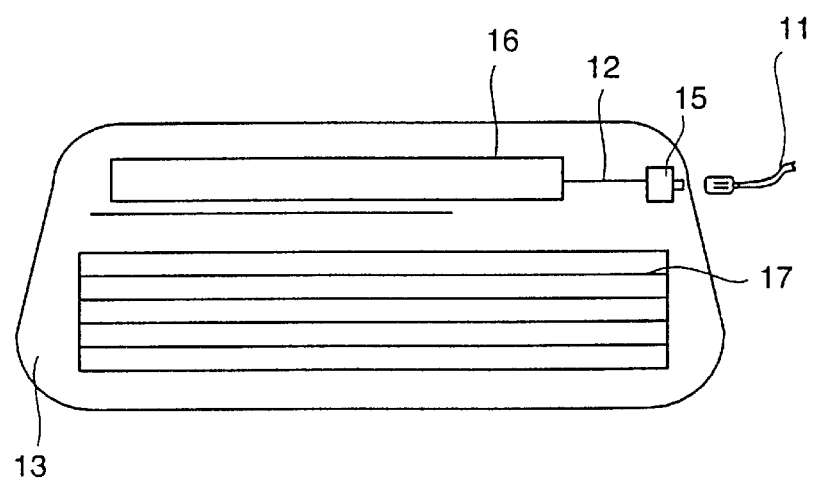
FIG. 8 shows a top plan view of how the electrical connecting element is connected to a wire arrangement implemented in a car window.

FIG. 8 illustrates one example of a readily mounted electrical connecting element 15, according to the present invention. During the mass production of the car windows (which is usually carried out in assembly lines) the car window 13, usually the rear window, is coated by screen printed conductive traces to form the window heater 17, the car antenna 16, or even both of these. The connecting element 15 is then connected to these conductive traces 17 and/or 16 by sticking it onto a conductive section 12 such that the electrical contact as described above is established. Once the contact is made and the window is placed into the car, cable 11 including a plug matching the connector 4 of the connecting element, may be attached thereto to couple the assembly to the car circuitry.

The connecting elements of the present invention do not have to be mounted by cost intensive procedures, such as soldering or the like, but can be easily applied like labels to the car windows 13, thus a significant reduction of manufacturing cost is achieved.

Although the present invention has been described in relation to particular embodiments thereof, many other variations and modifications and other uses will become apparent to those skilled in the art. It is preferred, therefore, that the present invention be limited not only by the specific disclosure therein, but only by the appended claims.

What is claimed is:

1. Electrical connecting element for connecting an antenna cable to a car antenna formed by a conductive portion provided on a car window said electrical connecting element comprising:
   at least one flexible sheet having an upper surface and a lower surface, the lower surface of said sheet being at least partially coated with a conductive adhesive;
   at least one connector disposed on the upper surface of said sheet for connection to the antenna cable; and
   at least one conductive trace disposed on the upper surface of said sheet, wherein at least one conductive trace is coupled to said conductive adhesive and said connector, wherein electronic components are coupled between said conductive trace and said connector, and said electronic components are part of an antenna matching module.

2. The electrical connecting element of claim 1, wherein said sheet is a non-conductive material.

3. The electrical connecting element of claim 1, wherein said sheet includes a through-hole, said conductive trace being coupled to said conductive adhesive through said through-hole.

4. The electrical connecting element of claim 3, wherein said through-hole is filled with a conductive material.

5. The electrical connecting element of claim 4, wherein said conductive material includes silver paste.

6. The electrical connecting element of claim 1, wherein said connector is adhesively attached to the upper surface of said sheet.

7. The electrical connecting element of claim 1, further comprising at least one additional adhesive having a high adhesive property provided on the lower surface of said sheet.

8. The electrical connecting element of claim 1, further comprising a protective cover laminated over the connecting element.

9. The electrical connecting element of claim 8, wherein said cover comprises a conductive layer for shielding the connecting element from electromagnetic waves.

10. The electrical connecting element of claim 1, wherein said conductive adhesive is disposed on the lower surface of said sheet in at least two regions, said at least two regions being electrically isolated from each other.

11. The electrical connecting element as claimed in claim 1, wherein said electrical connecting element is arranged on a carrier web.

12. Electrical connecting element for connecting an antenna formed by a conductive portion provided on a car window, said electrical connecting element comprising:
   at least one flexible sheet having an upper surface and a lower surface, the lower surface of said sheet being at least partially coated with a conductive adhesive;
   at least one connector disposed on the upper surface of said sheet for connection to the antenna cable, said connector being coupled to said conductive adhesives; and
   at least one pin perforating said sheet for contacting said conductive adhesive, wherein electronic components are coupled between said pin and said connector, and said electronic components are part of an antenna matching module.

13. The electrical connecting element of claim 12, wherein said connector is adhesively attached to and upper surface of said antenna matching module.

14. The electrical connecting element of claim 12, further comprising at least one additional adhesive having a high adhesive property provided on the lower surface of said sheet.

15. The electrical connecting element of claim 12, further comprising a protective cover laminated over the connecting element.

16. The electrical connecting element of claim 15, wherein said cover comprises a conductive layer for shielding the element from electromagnetic waves.

17. The electrical connecting element of claim 12, wherein said conductive adhesive is provided at said lower surface in at least two regions, said at least two regions being electrically isolated from each other.

18. The electrical connecting element of claim 12, wherein said electrical connecting element is arranged on a carrier web.

19. Electrical connecting element for connecting an antenna cable to a car antenna formed by a conductive portion provided on a car window, said electrical connecting element comprising:
   at least one flexible sheet having an upper surface and a lower surface, the lower surface of the sheet being at least partially coated with an adhesive;
   a connector disposed on the upper surface of said sheet for connection to the antenna cable;
   at least one conductive trace disposed on the upper surface of said sheet; and
   a through-hole disposed in said sheet, said through-hole being filled with a conductive material, wherein said conductive material protrudes from the lower surface of said sheet and said adhesive coated thereon for establishing an electrical contact with the conductive portion, wherein electronic components are coupled between said conductive trace and said connector and said electronic components are part of antenna matching module.

20. The electrical connecting element of claim 19; wherein said conductive material includes silver paste.

21. The electrical connecting element of claim 19, further comprising a protective cover laminated over the connecting element.

22. The electrical connecting element of claim 21, wherein said cover comprises a conductive layer for shielding the connecting element from electromagnetic waves.

23. The electrical connecting element of claim 19, wherein said electrical connecting element is arranged on a carrier web.

* * * * *